United States Patent
LV et al.

(10) Patent No.: US 9,972,643 B2
(45) Date of Patent: May 15, 2018

(54) ARRAY SUBSTRATE AND FABRICATION METHOD THEREOF, AND DISPLAY DEVICE

(71) Applicant: BOE TECHNOLOGY GROUP CO., LTD., Beijing (CN)

(72) Inventors: Zhijun LV, Beijing (CN); Ke Wang, Beijing (CN); Jiushi Wang, Beijing (CN); Fangzhen Zhang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days. days.

(21) Appl. No.: 14/892,067

(22) PCT Filed: Apr. 20, 2015

(86) PCT No.: PCT/CN2015/076954
§ 371 (c)(1),
(2) Date: Nov. 18, 2015

(87) PCT Pub. No.: WO2016/090807
PCT Pub. Date: Jun. 16, 2016

(65) Prior Publication Data
US 2016/0329352 A1  Nov. 10, 2016

(30) Foreign Application Priority Data
Dec. 12, 2014 (CN) .......................... 2014 1 0773384

(51) Int. Cl.
*H01L 29/786* (2006.01)
*H01L 27/12* (2006.01)
*H01L 21/77* (2017.01)

(52) U.S. Cl.
CPC .......... *H01L 27/1225* (2013.01); *H01L 21/77* (2013.01); *H01L 27/12* (2013.01);
(Continued)

(58) Field of Classification Search
CPC ........................ H01L 27/1248; H01L 27/3258
See application file for complete search history.

(56) References Cited

U.S. PATENT DOCUMENTS 7,479,415 B2  1/2009 Jeoung et al.
7,858,412 B2 * 12/2010 Kim ........................ H01L 27/12
                                              257/E21.025
(Continued)

FOREIGN PATENT DOCUMENTS

CN       1693972 A    11/2005
CN     101017291 A     8/2007
(Continued)

OTHER PUBLICATIONS

International Search Report of PCT/CN2015/076954 in Chinese, mailed Sep. 17, 2015 with English translation.
(Continued)

*Primary Examiner* — Allen Parker
*Assistant Examiner* — Wasiul Hairder
(74) *Attorney, Agent, or Firm* — Collard & Roe, P.C.

(57) ABSTRACT

An array substrate and a fabrication method thereof, and a display device are provided. The array substrate comprises: a thin film transistor (TFT 10) provided on a base substrate (01), a first passivation layer (200) provided on the thin film transistor (TFT 10), and a transparent electrode layer (300) provided on a surface of the first passivation layer (200). The first passivation layer (300) includes: a first sub-thin film layer (210), and a second sub-thin film layer (211) which is provided on a surface of the first sub-thin film layer (210) and in contact with the transparent electrode layer (300); and a film density of the second sub-thin film layer (211) is greater than that of the first sub-thin film layer (210).

17 Claims, 3 Drawing Sheets

(52) U.S. Cl.
CPC ........ *H01L 27/124* (2013.01); *H01L 27/1248* (2013.01); *H01L 27/1262* (2013.01); *H01L 2924/0002* (2013.01)

(56) References Cited

U.S. PATENT DOCUMENTS

| | | | |
|---|---|---|---|
| 8,461,594 B2* | 6/2013 | Morosawa | H01L 29/7869 257/410 |
| 8,928,828 B2 | 1/2015 | Guo et al. | |
| 9,209,306 B2* | 12/2015 | Uemura | H01L 29/78606 |
| 2012/0161141 A1 | 6/2012 | Jeon et al. | |
| 2014/0117359 A1 | 5/2014 | Yuan et al. | |
| 2014/0339537 A1* | 11/2014 | Bae | H01L 29/78636 257/43 |

FOREIGN PATENT DOCUMENTS

| | | |
|---|---|---|
| CN | 102420194 A | 4/2012 |
| CN | 102629609 A | 8/2012 |
| CN | 103000694 A | 3/2013 |
| CN | 103077943 A | 5/2013 |
| CN | 104133328 A | 11/2014 |
| CN | 104465670 A | 3/2015 |

OTHER PUBLICATIONS

Notice of Transmittal of the International Search Report of PCT/CN2015/076954 in Chinese, mailed Sep. 17, 2015.

Written Opinion of the International Searching Authority of PCT/CN2015/076954 in Chinese, mailed Sep. 17, 2015 with English translation.

Chinese Office Action in Chinese Application No. 201410773384.0, mailed Dec. 5, 2016 with English translation.

Second Chinese Office Action in Chinese Application No. 201410773384.0, dated Jun. 16, 2017 with English translation.

* cited by examiner

ARRAY SUBSTRATE AND FABRICATION METHOD THEREOF, AND DISPLAY DEVICE

CROSS REFERENCE TO RELATED APPLICATIONS

This application is the National Stage of PCT/CN2015/076954 filed on Apr. 20, 2015, which claims priority under 35 U.S.C. § 119 of Chinese Application No. 201410773384.0 filed on Dec. 12, 2014, the disclosure of which is incorporated by reference.

TECHNICAL FIELD

Embodiments of the present disclosure relate to an array substrate and a fabrication method thereof, and a display device.

BACKGROUND

Thin Film Transistor Liquid Crystal Display (TFT-LCD) is a flat-panel display device, and is more frequently applied to high-performance display field due to its advantages such as small size, low power consumption, no radiation and relatively low fabrication cost.

As shown in FIG. 1, a TFT 10 comprises a gate electrode 100, a gate insulating layer 101 and a semiconductor active layer 102 which are sequentially provided on the gate electrode 100, and a source electrode 103 and a drain electrode 104 respectively provided on both sides of the semiconductor active layer 102. In the case that a voltage applied to the gate electrode 100 is greater than or equal to a threshold voltage of the TFT 10, the semiconductor active layer 102 forms a conductive path, so that the source electrode 103 and the drain electrode 104 are connected with each other and the TFT 10 is turned on.

In order to prevent electrical properties of the TFT 10 from being affected, it is necessary to protect a surface of the semiconductor active layer 102; because a $SiO_2$ (silicon dioxide) thin film has excellent electrical insulating properties and fabrication feasibility, a $SiO_2$ passivation layer 105 made of $SiO_2$ is generally formed on the semiconductor active layer 102.

However, in a process of depositing the $SiO_2$ thin film, oxidation is accelerated due to the temperature, so the formed $SiO_2$ thin film has relatively loose structure. Therefore, there are a lot of holes on the surface of the $SiO_2$ thin film, resulting in decrease of adhesion of the surface of the $SiO_2$ thin film. In this way, in a process of forming a pixel electrode layer 106 on the surface of the passivation layer 105 made of $SiO_2$ by a patterning process, the pixel electrode layer 106 may peel off during removing a photoresist covering a pattern of the pixel electrode layer, thus seriously affecting product quality.

SUMMARY

According to embodiments of the disclosure, there is provided an array substrate. The array substrate comprises: a thin film transistor provided on a base substrate, a first passivation layer provided on the thin film transistor, and a transparent electrode layer provided on a surface of the first passivation layer. The first passivation layer includes: a first sub-thin film layer, and a second sub-thin film layer which is provided on a surface of the first sub-thin film layer and in contact with the transparent electrode layer; and a film density of the second sub-thin film layer is greater than that of the first sub-thin film layer.

According to the embodiments of the disclosure, there is provided a display device. The display device comprises the array substrate as described above.

According to the embodiments of the disclosure, there is provided a fabrication method of an array substrate. The fabrication method comprises: forming a thin film transistor on a base substrate by a patterning process; forming a first sub-thin film layer on the thin film transistor; forming a second sub-thin film layer on a surface of the first sub-thin film layer, wherein the first sub-thin film layer and the second sub-thin film layer form a first passivation layer, a film density of the second sub-thin film layer is greater than that of the first sub-thin film layer; and forming a transparent electrode layer on a surface of the first passivation layer by a patterning process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments of the disclosure will be described in a clearly and fully understandable way in connection with the drawings. It is obvious that the described embodiments are just a part but not all of the embodiments of the disclosure. Based on the described embodiments of the disclosure, those ordinarily skilled in the art can obtain other embodiment(s), without any inventive work, which should be within the protective scope of the disclosure.

Figure 1:
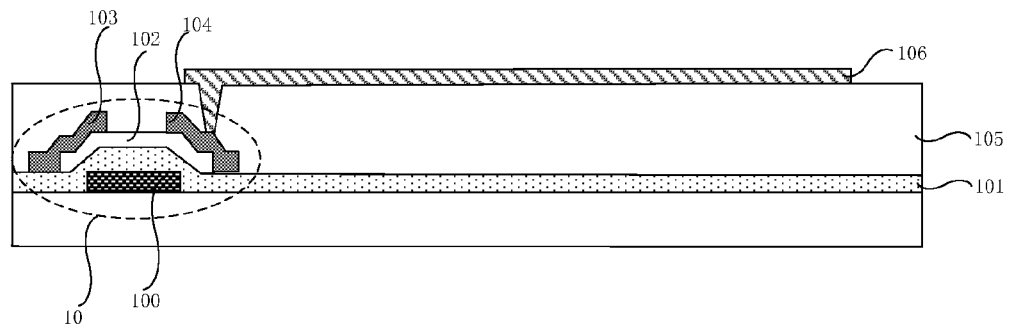
FIG. 1 is a structural schematic view illustrating an array substrate according to one technique.
Figure 2A:
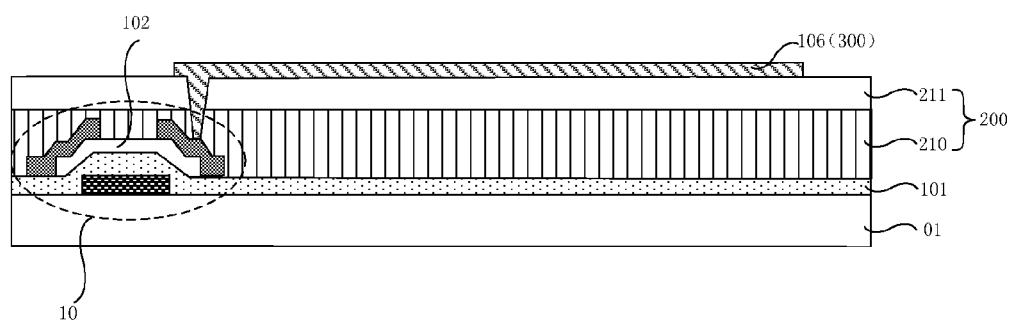
FIG. 2a is a structural schematic view illustrating an array substrate according to embodiments of the disclosure.
Figure 2B:
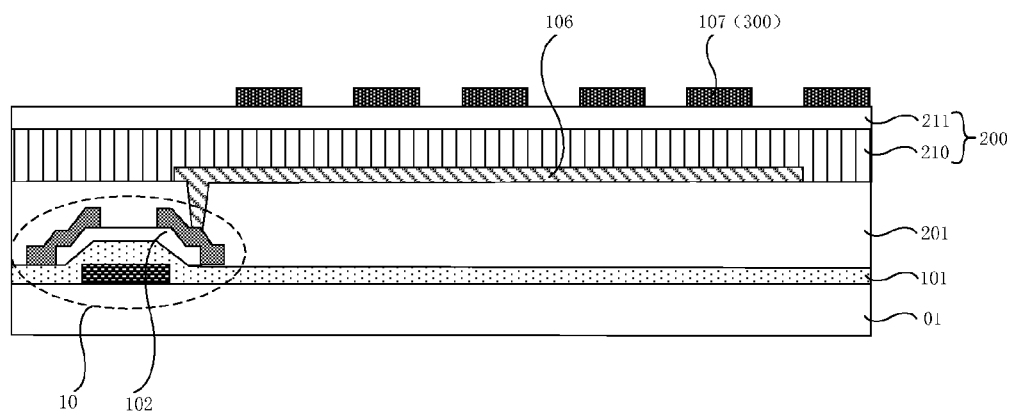
FIG. 2b is a structural schematic view illustrating another array substrate according to the embodiments of the disclosure.

Embodiments of the disclosure provide an array substrate. As shown in FIG. 2a or FIG. 2b, the array substrate comprises a TFT 10 provided on a base substrate 01, a first passivation layer 200 provided on the TFT 10, and a transparent electrode layer 300 provided on a surface of the first passivation layer 200. It should be noted that, "a first passivation layer 200 provided on the TFT 10" means that the first passivation layer 200 is provided on a side of the TFT 10 away from the base substrate 01.

The first passivation layer 200 for example includes: a first sub-thin film layer 210, and a second sub-thin film layer 211 which is provided on a surface of the first sub-thin film layer 210 and in contact with the transparent electrode layer 300.

A film density of the second sub-thin film layer 211 is greater than that of the first sub-thin film layer 210.

The embodiments of the disclosure provides the array substrate, the array substrate comprises the thin film transistor provided on the base substrate; in order to prevent electrical properties of the thin film transistor or other conductive film layers provided on the thin film transistor from being affected, the first passivation layer is further provided on the thin film transistor; and the transparent electrode layer is provided on the surface of the first passivation layer. The first passivation layer includes the first sub-thin film layer, and the second sub-thin film layer which is provided on the surface of the first sub-thin film layer and in contact with the transparent electrode layer; furthermore, the film density of the second sub-thin film layer is greater than that of the first sub-thin film layer. The higher the film density of the thin film is, the more compact the structure of the thin film layer is, and the less the holes on the surface of the thin film is. In the first passivation layer, the second sub-thin film layer having higher film density is in contact with the transparent electrode layer, so that the adhesion strength between the transparent electrode layer and the second sub-thin film layer is increased. As a result, in the case of fabricating the transparent electrode layer by a patterning process, it is possible to prevent the transparent electrode layer from peeling off from the surface of the second sub-thin film layer during removing a photoresist provided on the surface of the transparent electrode layer. Thus, product quality is improved.

It should be noted that, depending on roles of the transparent electrode layer 300, the position of the first passivation layer 200 in the array substrate may be changed, which will be described in detail hereinafter.

For a display device of Twist Nematic (TN) type, there is only one transparent electrode layer provided on the array substrate, and the transparent electrode layer 300 is a pixel electrode layer 106, as shown in FIG. 2a. In this case, the first passivation layer 200 provided on the TFT 10 is in contact with the TFT 10.

For a display device of Advanced-Super Dimensional Switching (ADS) type, there are two transparent electrode layers provided on the array substrate. The transparent electrode layer provided in an upper layer is of slit shape, and the transparent electrode layer provided in a lower layer is of plate shape. In the case that the transparent electrode layer 300 in provided in the upper layer and is used as a common electrode layer 107, a structure of the array substrate is as shown in FIG. 2b.

In this case, the first passivation layer 200 provided on the TFT 10 is not in direct contact with the TFT 10, and there are a pixel electrode layer 106 and a second passivation layer 201 provided between the TFT 10 and the first passivation layer 200.

As shown in FIG. 2b, the common electrode layer 107 is a slit-shaped electrode, so the contact area between the common electrode layer 107 and the first passivation layer 200 is relatively small, and the common electrode layer 107 is more easily peel off. However, in the case that the first passivation layer 200 is formed by the first sub-thin film layer 210 and the second sub-thin film layer 211 and the film density of the second sub-thin film layer 211 is greater than that of the first sub-thin film layer 210, a adhesion strength between the common electrode layer 107 and the second sub-thin film layer 211 is improved, and the common electrode layer 107 of slit shape is effectively prevented from peeling off.

For a display device of In Plane Switch (IPS) type, there are two transparent electrode layers provided on the array substrate. The two transparent electrode layers are of slit shape, and slits of one transparent electrode layer and slits of the other transparent electrode layer are alternately provided.

In this case, the transparent electrode layer (that is, the pixel electrode 106) in contact with the second passivation layer 201 is also a slit-shaped electrode, the contact area between the pixel electrode 106 and the second passivation layer 201 is relatively small; and therefore, in order to prevent the pixel electrode 106 from peeling off, the second passivation layer 201 for example is provided in a manner same as the first passivation layer 200, that is, the second passivation layer 201 is formed by two sub-thin film layers. In the second passivation layer 201, a sub-thin film layer in contact with the pixel electrode 106 has greater film density compared with the other sub-thin film layer not in contact with the pixel electrode 106, so it is possible to increase the adhesion strength between the pixel electrode 106 and the second passivation layer 201 to effectively prevent the pixel electrode 106 of slit shape from peeling off in the fabrication process.

It should be noted that, $SiO_2$ (silicon dioxide) thin film has excellent electrical insulating properties and fabrication feasibility; and thus, in the case that the TFT 10 in which a semiconductor active layer 102 is made of Low Temperature Poly-silicon (LTPS) or semiconductor oxide (such as, an indium gallium zinc oxide (IGZO)) adopts the $SiO_2$ thin film as the passivation layer, a film-forming atmosphere employed in the process of depositing the $SiO_2$ thin film by using Plasma Enhanced Chemical Vapor Deposition (PECVD) has less influence on the semiconductor active layer 102. Therefore, $SiO_2$ may be an ideal material for forming the passivation layer, for example, the first passivation layer 200.

However, because oxidation is accelerated due to temperature in the process of depositing the $SiO_2$ thin film, the formed $SiO_2$ thin film has relatively loose structure. Therefore, there are a lot of holes on the surface of the $SiO_2$ thin film, resulting in decrease of adhesion of the surface of the $SiO_2$ thin film. So, the transparent electrode layer 300 formed on the surface of the $SiO_2$ thin film may easily peel off. As compared with the $SiO_2$ thin film, a thin film formed by $SiN_x$ (silicon nitride) or SiON (silicon oxynitride) has higher density, relatively compact structure, and greater adhesion strength with the transparent conductive layer 300. However, in a process of fabricating the $SiN_x$ or SiON thin film, the film-forming atmosphere will affect the semiconductor active layer 102 formed by the LTPS or semiconductor oxide, reducing electrical properties of the TFT 10.

In consideration of the above advantages of the $SiO_2$ thin film and the $SiN_x$ or SiON thin film, $SiO_2$ for example is used as a material for forming the first sub-thin film layer 210; and at least one of SiON and $SiN_x$ for example is used as a material for forming the second sub-thin film layer 211.

It should be noted that, because influence of the $SiO_2$ thin film on electrical properties of the TFT is less than that of the $SiN_x$ or SiON thin film on the electrical properties of the TFT, the first sub-thin film layer made of $SiO_2$ for example has a thickness of 2000 angstroms or less; and the second sub-thin film layer made of at least one of $SiN_x$ and SiON for example has a thickness of 100 to 500 angstroms. In the case that the thickness of the second sub-thin film layer 211 is less than 100 angstroms, the thin film layer is too thin to be a good film. In the case that the thickness of the second sub-thin film layer 211 is greater than 500 angstroms, because the second sub-thin film layer is thicker, the time for forming the second sub-thin film layer is longer, the TFT is easily affected by the film-forming atmosphere for the second sub-thin film layer, which is not favorable to the electrical properties of the TFT.

For example, the first sub-thin film layer 210 is set to be thicker than the second sub-thin film layer 211; in this case, the transparent electrode layer 300 is prevented from peeling off from the first passivation layer 200, while the electrical properties of the TFT is prevented from being affected by film-forming atmosphere employed in the process of forming the first passivation layer 200.

Figure 3:
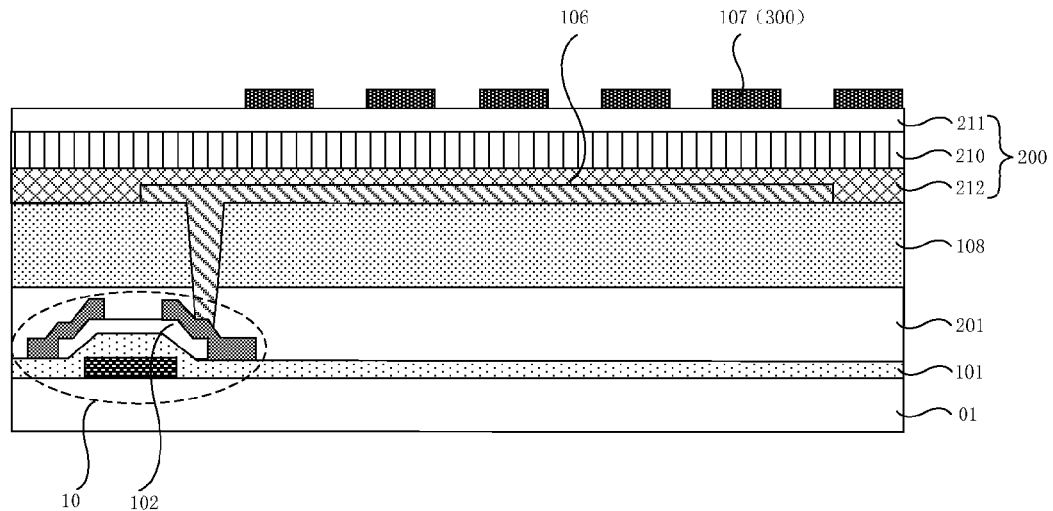
FIG. 3 is a structural schematic view illustrating still another array substrate according to the embodiments of the disclosure.

In the array substrate, in order to reduce parasitic capacitances between data lines (formed in a same layer as a source electrode 103 or a drain electrode 104 of the TFT) and the pixel electrode layer 106 and improve a switching speed of the TFT, as shown in FIG. 3, a transparent organic insulating layer 108 for example is formed between the pixel electrode layer 106 and the second passivation layer 201. The organic insulating layer 108 is generally thicker than the second passivation layer 201. As a result, in one aspect, a distance between the data lines and the pixel electrode layer 106 is increased by the organic insulating layer 108, and a relative dielectric constant of the organic insulating layer 108 is relatively low, so the parasitic capacitances described above are reduced; in another aspect, the organic insulating layer 108 is provided on the TFT, so that a part of light incident into the organic insulating layer 108 is emitted above the TFT region, thus increasing an aperture ratio of the display device.

Hereinafter, the structure of the array substrate provided with the organic insulating layer 108 will be described in detail.

As shown in FIG. 3, the array substrate further comprises: the second passivation layer 201 provided between the TFT 10 and the first passivation layer 200, and the organic insulating layer 108 and the pixel electrode layer 106 sequentially provided on the second passivation layer 201. By using the organic insulating layer 108, the parasitic capacitances between the data lines and the pixel electrode layer 106 are reduced, and the aperture ratio of the display panel is improved.

In addition, the first passivation layer 200 for example further includes: a third sub-thin film layer 212 which is in contact with the organic insulating layer 108 and the pixel electrode layer 106, and the third sub-thin film layer 212 is made of at least one of SiNx and SiON.

As described above, $SiO_2$ for example is used as the material for forming the first sub-thin film layer 210. A lot of $N_2O$ gas is used in the case that the first sub-thin film layer 210 is made of $SiO_2$, and $N_2O$ gas will react with the organic insulating layer 108. In order to avoid this problem, the third sub-thin film layer 212 is provided between the first sub-thin film layer 210 and the organic insulating layer 108.

In the case that the third sub-thin film layer 212 made of SiNx or SiON is deposited on the organic thin film layer 108 by using PECVD, $N_2O$ gas is not used in the film-forming atmosphere, or only a small amount of $N_2O$ gas is used. Thereby, a chance of reaction between $N_2O$ gas and the organic insulating layer 108 is reduced, the surface of the organic insulating layer 108 provided at an edge of the pixel electrode 106 is prevented from forming holes due to the reaction between $N_2O$ gas and the organic insulating layer 108. Accordingly, tolerance of the array substrate is improved, so as to avoid degradation of the array substrate caused by poor tolerance in a high temperature or high-pressure test.

For example, the third sub-thin film layer 212 has a thickness of 100 to 500 angstroms. In the case that the thickness of the third sub-thin film layer 212 is less than 100 angstroms, the thin film layer is too thin to be a good film. In the case that the thickness of the third sub-thin film layer 212 is greater than 500 angstroms, because the third sub-thin film layer 212 is thicker, the time for forming the third sub-thin film layer 212 is longer, and thus a chance of reaction between $N_2O$ gas in film-forming atmosphere and the organic insulating layer 108 is increased, so a chance of holes to be formed on the surface of the organic insulating layer 108 provided at the edge of the pixel electrode 106 is increased, which is not favorable to improve the tolerance of the array substrate.

In addition, in the case that the semiconductor active layer 102 of the TFT 10 is made of semiconductor oxide or LTPS, the TFT has higher mobility. Specifically, the mobility of carriers of the TFT 10 is 20 to 30 times of that of the TFT 10 with the semiconductor active layer made of amorphous silicon (a-Si).

However, compared with the case that the semiconductor oxide is used to from the semiconductor active layer, more exposing processes are needed and it is needed to transform amorphous silicon to polycrystalline silicon by using laser irradiation in the case that LTPS is used to form the semiconductor active layer. Therefore, in the case that LTPS is used to form the semiconductor active layer, fabrication cost is higher.

For example, the semiconductor active layer 102 in the embodiments is made of the semiconductor oxide, such as zinc oxide (ZnO), cadmium oxide (CdO), aluminum oxide ($Al_2O_3$), indium gallium zinc oxide (IGZO) and the like.

The embodiments of the disclosure provide a display device, and the display device comprises the array substrate as described above. The display device has advantageous effects same as those of the array substrate as described above, which will not be repeated here.

It should be noted that, in the embodiments of the disclosure, the display device for example includes a liquid crystal display device; and the display device for example is a liquid crystal display, a liquid crystal television, a digital photo frame, a mobile phone, a tablet personal computer, or any other product or component having a display function.

Figure 4:
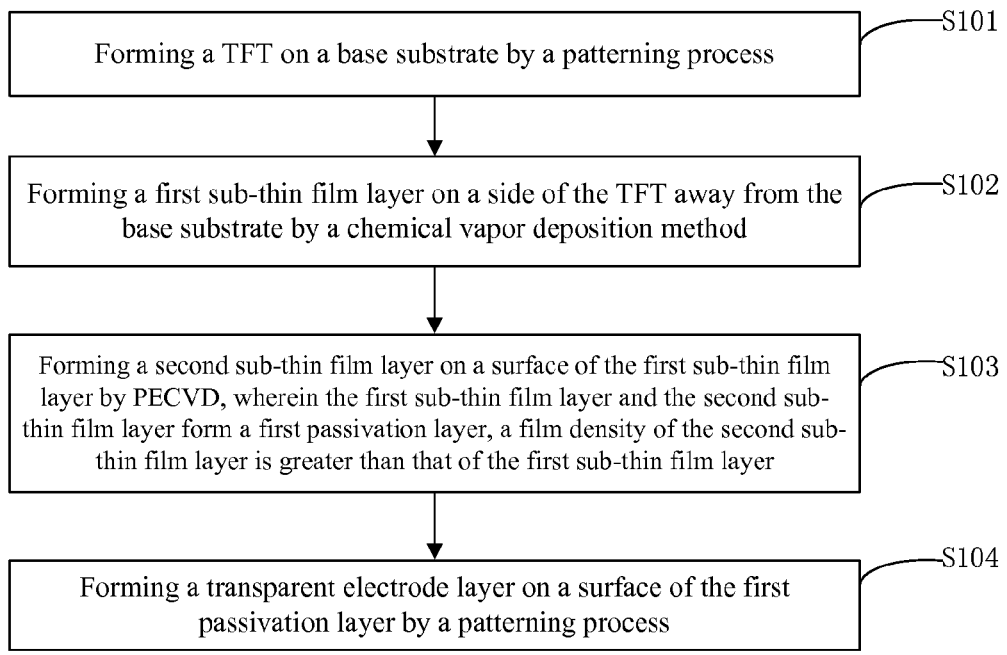
FIG. 4 is a flow chart of a fabrication method of an array substrate according to the embodiments of the disclosure.

The embodiments of the disclosure provide a fabrication method of an array substrate. As shown in FIG. 4, the method comprises:

S101: forming a TFT 10 on a base substrate 01 by a patterning process.

S102: forming a first sub-thin film layer 210 on the TFT 10 by a chemical vapor deposition method, such as PECVD.

S103: forming a second sub-thin film layer 211 on a surface of the first sub-thin film layer 210 by PECVD, wherein, the first sub-thin film layer 210 and the second sub-thin film layer 211 form a first passivation layer 200, a film density of the second sub-thin film layer 211 is greater than that of the first sub-thin film layer 210.

S104: forming a transparent electrode layer 300 on a surface of the first passivation layer 200 by a patterning process.

The embodiments of the disclosure provide the fabrication method of the array substrate, the method comprises: firstly forming the thin film transistor on the base substrate by the patterning process. In order to prevent electrical properties of the thin film transistor or other conductive film layers provided on the thin film transistor from being affected, the method further comprises: forming the first sub-thin film layer on the thin film transistor by the chemical vapor deposition method; then, forming the second sub-thin film layer on the surface of the first sub-thin film layer by the chemical vapor deposition method. The first sub-thin film layer and the second sub-thin film layer form the first passivation layer, and the film density of the second sub-thin film layer is greater than that of the first sub-thin film layer. The method further comprises: forming the transparent electrode layer on the surface of the first passivation layer by the patterning process. Because the film density of the second sub-thin film layer is greater than that of the first sub-thin film layer, the film density of the second sub-thin film layer is higher, the second sub-thin film layer has compact structure, and there are few holes on the surface of the second sub-thin film layer. Therefore, in the case that the transparent electrode layer is formed on the surface of the second sub-thin film layer, the adhesion strength between the transparent electrode layer and the second sub-thin film layer is improved. As a result, in the case of fabricating the transparent electrode layer by a patterning process, it is possible to prevent the transparent electrode layer from peeling off from the surface of the second sub-thin film layer during removing a photoresist provided on the surface of the transparent electrode layer. Thus, product quality is improved.

It should be noted that the patterning process in the embodiments of the disclosure may include a photolithographic process, and other processes for forming a predetermined pattern, such as printing, inkjeting and so on. The photolithographic process includes processes of film forming, exposing, developing, etching and the like with using photoresist, mask, and exposure machine, etc to form the predetermined pattern. The pattering process may be selected according to the structure to be formed in embodiments of the disclosure.

It should be noted that, depending on roles of the transparent electrode layer 300, the position of the first passivation layer 200 in the array substrate may be changed so that the orders of the steps in the fabrication process of the array substrate may be changed, which will be described in detail hereinafter.

As shown in FIG. 2a, in the case that the transparent electrode layer 300 is a pixel electrode layer 106, the first passivation layer 200 is formed by using step S102 after the above step S101 to be in contact with the TFT 10.

As shown in FIG. 2b, in the case that the transparent electrode layer 300 is a common electrode layer 107, Step S102 includes: before forming the first passivation layer 200, forming a second passivation layer 201 in contact with the TFT 10 and then forming a pixel electrode layer 106 on a surface of the second passivation layer 201.

As shown in FIG. 2b, the common electrode layer 107 is a slit-shaped electrode, so the contact area between the common electrode layer 107 and the first passivation layer 200 is relatively small, and the common electrode layer 107 is more easily peel off. However, in the case that the first passivation layer 200 is formed by the first sub-thin film layer 210 and the second sub-thin film layer 211 and the film density of the second sub-thin film layer 211 is greater than that of the first sub-thin film layer 210, the adhesion strength between the common electrode layer 107 and the second sub-thin film layer 211 is improved, and the common electrode layer 107 of slit shape is effectively prevented from peeling off.

In addition, in the case that the transparent electrode layer (that is, the pixel electrode 106) in contact with the second passivation layer 201 is also a slit-shaped electrode, the contact area between the pixel electrode 106 and the second passivation layer 201 is relatively small; and therefore, in order to prevent the pixel electrode 106 from peeling off, the second passivation layer 201 for example is provided in a manner same as the first passivation layer 200, that is, the second passivation layer 201 is formed by two sub-thin film layers. In the second passivation layer 201, a sub-thin film layer in contact with the pixel electrode 106 has greater film density compared with the other sub-thin film layer not in contact with the pixel electrode 106, so it is possible to increase the adhesion strength between the pixel electrode 106 and the second passivation layer 201 to effectively prevent the pixel electrode 106 of slit shape from peeling off in the fabrication process.

It should be noted that, $SiO_2$ (silicon dioxide) thin film has excellent electrical insulating properties and fabrication feasibility; and thus, in the case that the TFT 10 in which a semiconductor active layer 102 is made of LTPS or semiconductor oxide (such as, an indium gallium zinc oxide (IGZO)) adopts the $SiO_2$ thin film as the passivation layer, a film-forming atmosphere employed in the process of depositing the $SiO_2$ thin film by using PECVD has less influence on the semiconductor active layer 102. Therefore, $SiO_2$ may be an ideal material for forming the passivation layer, for example, the first passivation layer 200.

However, because oxidation is accelerated due to temperature in the process of depositing the $SiO_2$ thin film, the formed $SiO_2$ thin film has relatively loose structure. Therefore, there are a lot of holes on the surface of the $SiO_2$ thin film, resulting in decrease of adhesion of the surface of the $SiO_2$ thin film. So, the transparent electrode layer 300 formed on the surface of the $SiO_2$ thin film may easily peel off. As compared with the $SiO_2$ thin film, a thin film formed by SiNx (silicon nitride) or SiON (silicon oxynitride) has higher density, relatively compact structure, and greater adhesion strength with the transparent conductive layer 300. However, in a process of fabricating the SiNx or SiON thin film, the film-forming atmosphere will affect the semiconductor active layer 102 formed by the LTPS or semiconductor oxide, reducing electrical properties of the TFT 10.

In consideration of the above advantages of the $SiO_2$ thin film and the SiNx or SiON thin film, $SiO_2$ for example is used as a material for forming the first sub-thin film layer 210; and at least one of SiON and SiNx for example is used as a material for forming the second sub-thin film layer 211.

It should be noted that, because influence of the $SiO_2$ thin film on electrical properties of the TFT is less than that of the SiNx or SiON thin film on the electrical properties of the TFT, the first sub-thin film layer made of $SiO_2$ for example has a thickness of 2000 angstroms or less; and the second sub-thin film layer made of at least one of SiNx and SiON for example has a thickness of 100 to 500 angstroms. In the case that the thickness of the second sub-thin film layer 211 is less than 100 angstroms, the thin film layer is too thin to be a good film. In the case that the thickness of the second sub-thin film layer 211 is greater than 500 angstroms, because the second sub-thin film layer is thicker, the time for forming the second sub-thin film layer is longer, the TFT is easily affected by the film-forming atmosphere for the second sub-thin film layer, which is not favorable to the electrical properties of the TFT.

For example, the first sub-thin film layer 210 is set to be thicker than the second sub-thin film layer 211; in this case, the transparent electrode layer 300 is prevented from peeling off from the first passivation layer 200, while the electrical properties of the TFT is prevented from being affected by film-forming atmosphere employed in the process of forming the first passivation layer 200.

In fabrication process of the array substrate, in order to reduce parasitic capacitances between data lines and the pixel electrode layer 106 and improve a switching speed of the TFT, a transparent organic insulating layer 108 for example is formed between the pixel electrode layer 106 and the second passivation layer 201, as shown in FIG. 3.

Hereinafter, the fabrication method of the array substrate provided in which the organic insulating layer 108 is formed will be described in detail.

Figure 5:
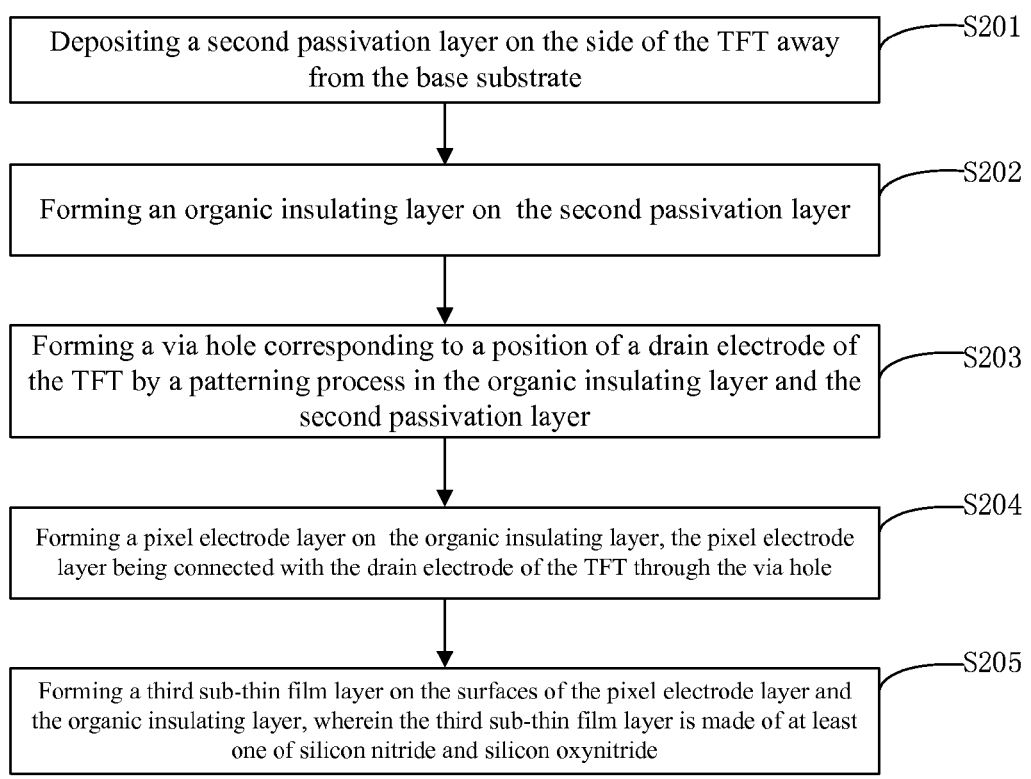
FIG. 5 is a flow chart of another fabrication method of an array substrate according to the embodiments of the disclosure.

A shown in FIG. 5, the fabrication method for example comprises:

S201: depositing the second passivation layer 201 on a side of the TFT 10 away from the base substrate 01.

S202: forming the organic insulating layer 108 on the second passivation layer 201.

By using the organic insulating layer 108, the parasitic capacitances between the data line and the pixel electrode layer 106 are reduced, and the aperture ratio of the display panel is improved.

A shown in FIG. 5, the fabrication method further comprises:

S203: forming a via hole corresponding to a position of a drain electrode 104 of the TFT 10 by a patterning process in the organic insulating layer 108 and the second passivation layer 201.

S204: forming the pixel electrode layer 106 on the organic insulating layer 108, the pixel electrode layer 106 being connected with the drain electrode 104 of the TFT 10 through the via hole.

S205: forming a third sub-thin film layer 212 on the surfaces of the pixel electrode layer 106 and the organic insulating layer 108, wherein, the third sub-thin film layer 212 is made of at least one of silicon nitride or silicon oxynitride.

In the case that the third sub-thin film layer 212 made of SiNx or SiON is deposited on the surface of the organic thin film layer 108 by using PECVD, $N_2O$ gas is not used in the film-forming atmosphere, or only a small amount of $N_2O$ gas is used. Thereby, a chance of reaction between $N_2O$ gas and the organic insulating layer 108 is reduced, the surface of the organic insulating layer 108 provided at an edge of the pixel electrode 106 is prevented from forming holes due to the reaction between $N_2O$ gas and the organic insulating layer 108. Accordingly, tolerance of the array substrate is improved, so as to avoid degradation of the array substrate caused by poor tolerance in a high temperature or high-pressure test.

For example, the third sub-thin film layer 212 has a thickness of 100 to 500 angstroms. In the case that the thickness of the third sub-thin film layer 212 is less than 100 angstroms, the thin film layer is too thin to be a good film. In the case that the thickness of the third sub-thin film layer 212 is greater than 500 angstroms, because the third sub-thin film layer 212 is thicker, the time for forming the third sub-thin film layer 212 is longer, and thus a chance of reaction between $N_2O$ gas in film-forming atmosphere and the organic insulating layer 108 is increased, so a chance of holes to be formed on the surface of the organic insulating layer 108 provided at the edge of the pixel electrode 106 is increased, which is not favorable to improve the tolerance of the array substrate.

For example, the semiconductor active layer 102 is made of a semiconductor oxide, such as Zinc oxide (ZnO), cadmium oxide (CdO), aluminum oxide ($Al_2O_3$), indium gallium zinc oxide (IGZO) and the like. As compared with the case that the semiconductor active layer 102 is made of LTPS, production process is simplified and cost is reduced while a higher mobility of the TFT 10 is obtained in the case that the semiconductor active layer 102 is made of semiconductor oxide.

The foregoing embodiments merely are exemplary embodiments of the disclosure, and not intended to define the scope of the disclosure, and the scope of the disclosure is determined by the appended claims.

The present application claims priority of Chinese Patent Application No. 201410773384.0 filed on Dec. 12, 2014, the disclosure of which is incorporated herein by reference in its entirety as part of the present application.

The invention claimed is:

1. An array substrate, comprising a thin film transistor provided on a base substrate, a first passivation layer provided on the thin film transistor, and a transparent electrode layer provided on a surface of the first passivation layer, wherein,
   the first passivation layer includes: a first sub-thin film layer, and a second sub-thin film layer which is provided on a surface of the first sub-thin film layer and in contact with the transparent electrode layer;
   a film density of the second sub-thin film layer is greater than that of the first sub-thin film layer;
   the array substrate further comprises: a second passivation layer provided between the thin film transistor and the first passivation layer, and an organic insulating layer and a pixel electrode layer sequentially provided on the second passivation layer; and
   the first passivation layer further includes a third sub-thin film layer which is in contact with the organic insulating layer and the pixel electrode layer, and the third sub-thin film layer is made of at least one of silicon nitride and silicon oxynitride.

2. The array substrate according to claim 1, wherein,
   the first sub-thin film layer is made of silicon dioxide;
   the second sub-thin film layer is made of at least one of silicon nitride and silicon oxynitride.

3. The array substrate according to claim 2, wherein,
   the first sub-thin film layer has a thickness of 2000 angstroms or less; and
   the second sub-thin film layer has a thickness of 100 to 500 angstroms.

4. The array substrate according to claim 1, wherein,
   a semiconductor active layer of the thin film transistor is made of an oxide semiconductor material.

5. A display device, comprising the array substrate according to claim 1.

6. The array substrate according to claim 1, wherein,
   the first sub-thin film layer has a thickness of 2000 angstroms or less; and
   each of the second sub-thin film layer and the third sub-thin film layer has a thickness of 100 to 500 angstroms.

7. The array substrate according to claim 1, wherein,
   a thickness of the first sub-thin film layer is larger than a thickness of the second sub-thin film layer.

8. A fabrication method of an array substrate, comprising:
   forming a thin film transistor on a base substrate by a patterning process;
   forming a first sub-thin film layer on the thin film transistor;
   forming a second sub-thin film layer on a surface of the first sub-thin film layer, wherein the first sub-thin film layer and the second sub-thin film layer form a first passivation layer, a film density of the second sub-thin film layer is greater than that of the first sub-thin film layer; and forming a transparent electrode layer on a surface of the first passivation layer by a patterning process, wherein, after forming the thin film transistor and before forming the first sub-thin film layer, the method comprises:

forming a second passivation layer on a side of the thin film transistor away from the base substrate;

forming an organic insulating layer on the second passivation layer;

forming a via hole corresponding to a position of a drain electrode of the thin film transistor by a patterning process in the organic insulating layer and the second passivation layer;

forming a pixel electrode layer on the organic insulating layer, the pixel electrode layer being connected with the drain electrode of the thin film transistor through the via hole; and forming a third sub-thin film layer on the surfaces of the pixel electrode layer and the organic insulating layer, the third sub-thin film layer being made of at least one of silicon nitride and silicon oxynitride.

9. The fabrication method of the array substrate according to claim 8, wherein, the first sub-thin film layer is made of silicon dioxide;

the second sub-thin film layer is made of silicon nitride or silicon oxynitride.

10. The fabrication method of the array substrate according to claim 9, wherein, the first sub-thin film layer has a thickness of 2000 angstroms or less; and the second sub-thin film layer has a thickness of 100 to 500 angstroms.

11. The fabrication method of the array substrate according to claim 9, wherein a semiconductor active layer of the thin film transistor is made of an oxide semiconductor material.

12. The fabrication method of the array substrate according to claim 8, wherein, the first sub-thin film layer has a thickness of 2000 angstroms or less; and each of the second sub-thin film layer and the third sub-thin film layer has a thickness of 100 to 500 angstroms.

13. The fabrication method of the array substrate according to claim 8, wherein, a thickness of the first sub-thin film layer is larger than a thickness of the second sub-thin film layer.

14. An array substrate, comprising a thin film transistor provided on a base substrate, a first passivation layer provided on the thin film transistor, and a transparent electrode layer provided on a surface of the first passivation layer, wherein, the first passivation layer includes: a first sub-thin film layer, and a second sub-thin film layer which is provided on a surface of the first sub-thin film layer and in contact with the transparent electrode layer;

a film density of the second sub-thin film layer is greater than that of the first sub-thin film layer; and both the first sub-thin film layer and the second sub-thin film layer cover an entirety of source and drain electrodes of the thin film transistor.

15. The array substrate according to claim 14, wherein, the second sub-thin film layer directly contacts the first sub-thin film layer at an entire surface of the first sub-thin film layer.

16. The array substrate according to claim 14, wherein, the array substrate further comprises: a second passivation layer provided between the thin film transistor and the first passivation layer, and another transparent electrode layer provided between the second passivation layer and the first passivation layer.

17. The array substrate according to claim 16, wherein, the second passivation layer includes: a third sub-thin film layer, and a fourth sub-thin film layer which is provided on a surface of the third sub-thin film layer and in contact with the another transparent electrode layer; and a film density of the fourth sub-thin film layer is greater than that of the third sub-thin film layer.

* * * * *